United States Patent [19]

Ueberreiter

[11] Patent Number: 4,694,964

[45] Date of Patent: Sep. 22, 1987

[54] DEVICE FOR CONVEYING COMPONENTS PARTICULARLY INTEGRATED CHIPS, FROM AN INPUT MAGAZINE TO AN OUTPUT MAGAZINE

[76] Inventor: Ekkehard Ueberreiter, Karwendelstrasse 1, D-8011 Zorneding/Pöring, Fed. Rep. of Germany

[21] Appl. No.: 917,292

[22] Filed: Oct. 8, 1986

Related U.S. Application Data

[63] Continuation of Ser. No. 820,891, Jan. 17, 1986, abandoned, which is a continuation of Ser. No. 666,826, Oct. 31, 1984, abandoned.

[30] Foreign Application Priority Data

Nov. 7, 1983 [DE] Fed. Rep. of Germany ....... 3340183

[51] Int. Cl.⁴ ......................... B07C 5/34; G01R 31/28

[52] U.S. Cl. .................................... 209/549; 209/573; 324/73 AT; 324/158 F; 364/478; 364/481; 364/579

[58] Field of Search ............... 209/546, 551, 573, 548, 209/549, 574; 324/158 F, 73 R, 73 AT, 73 PC; 364/478, 479, 480, 481, 579, 580; 371/20

[56] References Cited

U.S. PATENT DOCUMENTS

| | | | |
|---|---|---|---|
| 431,699 | 7/1890 | Leake | 406/182 X |
| 3,017,025 | 1/1962 | Stephen | 209/574 |
| 3,032,191 | 5/1962 | Clukey | 209/573 X |
| 3,142,382 | 7/1964 | Knowles et al. | 209/573 X |
| 3,664,499 | 5/1972 | Sahakian | 209/573 |
| 3,716,786 | 2/1973 | Gearin | 324/158 F |
| 3,727,757 | 4/1973 | Boissicat | 209/573 |
| 3,896,935 | 7/1975 | Hjelle et al. | 209/573 |
| 4,170,290 | 10/1979 | Frisbie et al. | 198/524 |
| 4,230,985 | 10/1980 | Matrone et al. | 324/158 F |
| 4,234,418 | 11/1980 | Boissicat | 209/542 |
| 4,478,352 | 10/1984 | Amundson et al. | 209/573 X |

FOREIGN PATENT DOCUMENTS

| | | | |
|---|---|---|---|
| 0007650 | 2/1980 | European Pat. Off. | 209/573 |
| 2855913 | 6/1980 | Fed. Rep. of Germany . | |
| 55-27955 | 2/1980 | Japan | 209/573 |
| 56-77765 | 6/1981 | Japan | 324/158 F |
| 0970386 | 10/1982 | U.S.S.R. | 364/478 |
| 0980027 | 12/1982 | U.S.S.R. | 324/73 AT |

OTHER PUBLICATIONS

*Apparatus for Minimal Test/Sorting for Partial Good Categories,* Aichelmann, Jr. et al., IBM Technical Disclosure Bulletin, vol. 25, No. 12, May 1983, pp. 6630-6631.

*Primary Examiner*—Robert B. Reeves
*Assistant Examiner*—Edward M. Wacyra
*Attorney, Agent, or Firm*—Fitzpatrick, Cella, Harper & Scinto

[57] ABSTRACT

In a device for conveying components contained in an input magazine, particularly integrated chips, to an output magazine (3), which is connected to the input magazine by means of a testing device, individual component receiving portions (34) of the output magazine (3) are provided with storage and indicating devices (52), each of which store and indicate information corresponding to a component testing and measuring class. The components are supplied to the receiving portions (34) of the output magazine (3), on the basis of the data stored in the individual storage and indicating devices (52), so that a component determined by the testing device as belonging to a certain component test and measuring class is conveyed to the receiving portions (34) associated with this class, and in the absence of such a receiving portion is conveyed to a receiving portion which is still free, which is then marked as belonging to the test and measuring class in question.

10 Claims, 10 Drawing Figures

DEVICE FOR CONVEYING COMPONENTS PARTICULARLY INTEGRATED CHIPS, FROM AN INPUT MAGAZINE TO AN OUTPUT MAGAZINE

This application is a continuation of application Ser. No. 820,891 filed Jan. 17, 1986, now abandoned, which is a continuation of application Ser. No. 666,826 filed Oct. 31, 1984, now abandoned.

TECHNICAL FIELD OF THE INVENTION

The invention relates to a device for conveying components received in individual, separate receiving portions of an input magazine, particularly integrated chips, to individual, separate receiving portions of an output magazine, with a testing device arranged between the input and the output magazine, to which device are supplied, by means of a first conveyor device, the individual components from the receiving portions of the input magazine, one after the other, for testing, and which discharges the tested components to a second conveyor device which enables the components concerned to be discharged to receiving portions of the output magazine established by the testing device.

BRIEF DESCRIPTION OF THE PRIOR ART

A device of the type described above is generally already known (EP-A1-7650). The disadvantage of this known device, however, is that a relatively high construction cost is required to discharge the individual tested components from the measuring device to the output magazine. A further disadvantage is that the allocation of the individual receiving portions of the output magazine cannot be adapted without difficulty to the requirements imposed.

OBJECT OF THE INVENTION

The fundamental object of the invention is therefore to demonstrate a method of conveying components from the measuring device to the output magazine at an extremely low construction cost, with a device of the type already mentioned, and at the same time a method of introducing the component concerned into such a receiving portion belonging to any component testing or measuring class.

SUMMARY OF THE INVENTION

The object described above is achieved according to the invention with a device of the type already mentioned in that storage and indicating devices are provided for the individual receiving portions of the output magazine, each of which devices is capable of storing and indicating information corresponding to (associated with) a component testing or measuring class, and in that the second conveyor device can be moved in a such a manner, relative to the receiving portions of the output magazine, on the basis of data stored in the individual storage and indicating devices, that a component established by the testing device as belonging to a certain component testing or measuring class can be discharged into the receiving portion associated with this testing or measuring class or, in the absence of such a receiving portion into a receiving portion of the output magazine which may also be allocated to a component testing or measuring class, whilst establishing and indicating this allocation in or by the storage and indicating device associated with the said receiving portion.

The invention has the advantage that a method is provided, at relatively low overall construction cost, for inserting the tested components discharged by the testing device to the second conveyor device into the said receiving portions of the output magazine. A further advantage is that the allocation of the said receiving portions of the output magazine to the individual component measuring and test classes can be established automatically, hence a test and measuring class range need not be established from the start, only to prove too narrow a range in the course of operation.

Each receiving portion of the output magazine is suitably provided with a storage area for a storage device, and a multi-segment indicating device. This has the advantage of extremely low cost in establishing and indicating the assignment of a particular receiving portion in the output magazine to the established testing and measuring class. The said storage device may in this case be formed by a storage device assigned to the multi-segment indicating device, or provided on this device, and/or by a storage device provided in a control unit.

After its associated receiving portion has been emptied, each storage and indicating device should preferably be able to be returned to its initial condition. This has the advantage of ensuring that each emptied receiving portion is ready to be re-used.

Each receiving portion preferably has an alarm device which, when the relevant receiving portion is completely filled with components, indicates this receiving portion as being no longer able to receive components. This affords the advantage that further components cannot be incorrectly fed to a receiving portion already filled with components.

The second conveyor device should preferably be able to receive only one component at a time. This has the advantage of a second conveyor device which is extremely simple to construct.

The second conveyor device is suitably moved in relation to the recesses of the output magazine by means of a pull rope device, and adjusted by means of a swivel device between a component discharge position and a component locking position. This affords the advantage that the movement and adjustment of the second conveyor device can be provided at relatively low overall construction cost.

The receiving portions of the output magazine should preferably be sealed on their component discharge side by a spring element which can be brought out of a locking position into a release position by means of an emptying device. This has the advantage of being able to form the receiving portions of the output magazine at an extremely low construction cost.

The invention is explained in greater detail below on the basis of an embodiment described with reference to drawings.

DESCRIPTION OF THE PREFERRED EMBODIMENT

Figure 1:
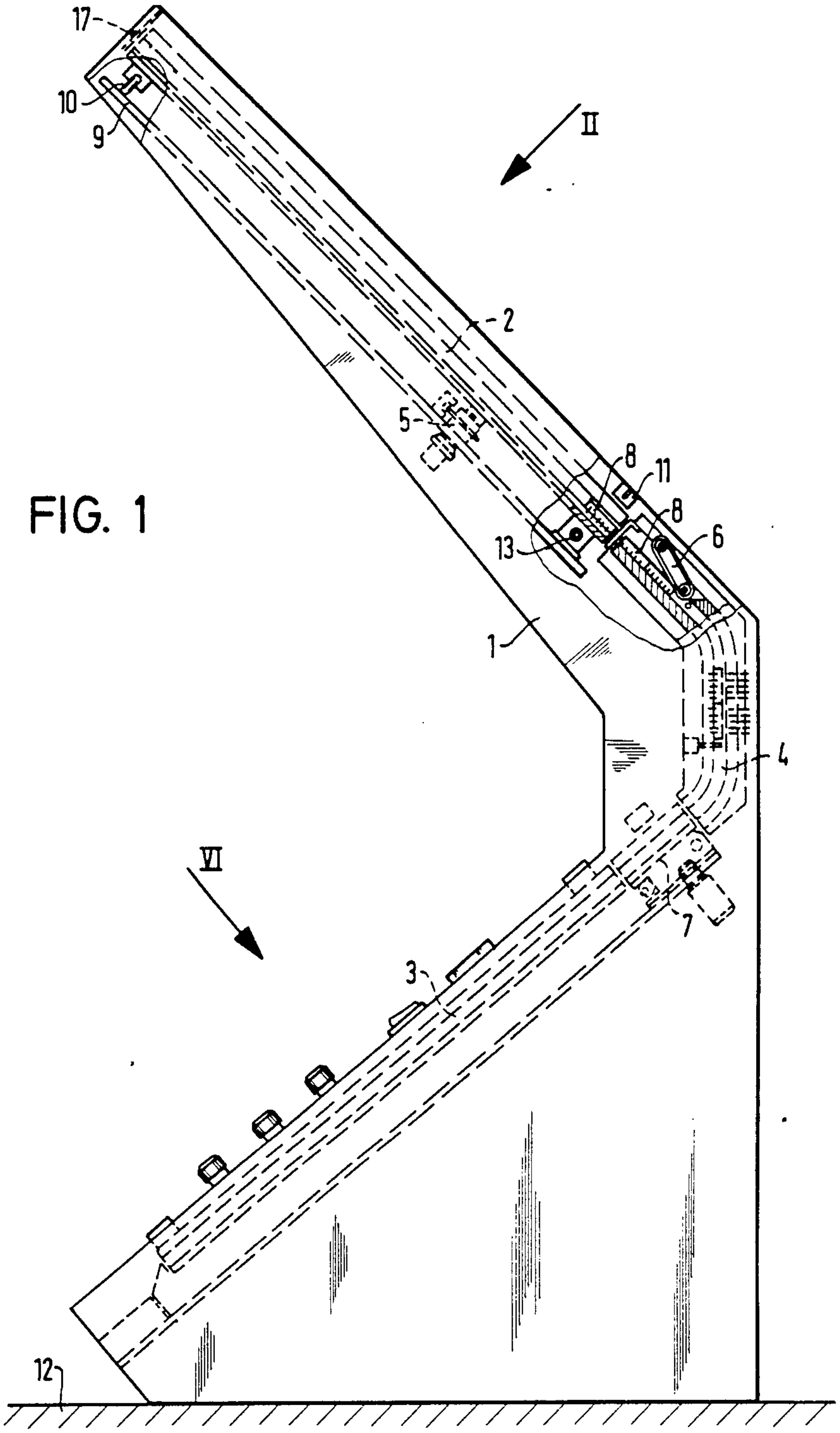
FIG. 1 shows diagrammatically, on a reduced scale, a side view of a machine used for receiving and testing components, in which the device according to the invention is used.

A machine 1 used for receiving and testing components is shown diagrammatically in FIG. 1. The components are in this particular case integrated chips 8, some of which are shown in FIG. 1.

Machine 1, standing on a floor or foundation 12, exhibits in its upper area an obliquely positioned input magazine 2, and in its lower area an obliquely positioned output magazine 3. A testing device 4 is provided between input magazine 2 and output magazine 3, in which device individual components 8, discharged from input magazine 2, may be tested and from which these tested components may be discharged to output magazine 3.

Figure 2:
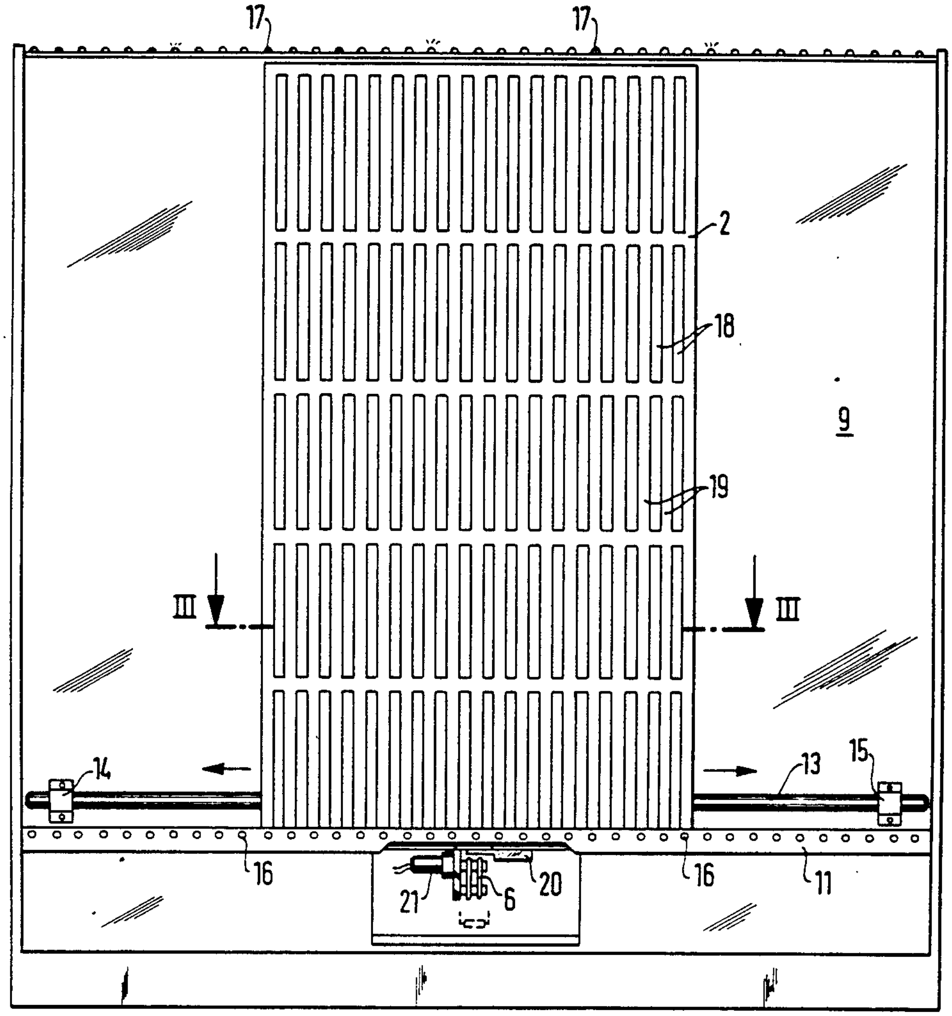
FIG. 2 shows in an elevation, along arrow II drawn in FIG. 1, an input magazine for receiving components.

Input magazine 2, which is shown in FIG. 2 in elevation, may be displaced along a support bar 13, which is fitted to a baseplate 9 by means of fastening parts 14, 15. At a certain distance from support bar 13, input magazine 2 has at least one roller 10, with which it is able to run along the baseplate when displaced.

Figure 3:
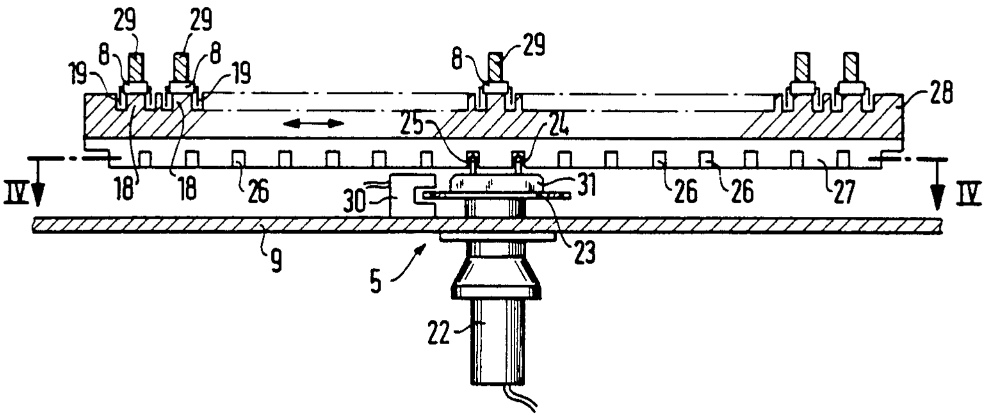
FIG. 3 shows on an enlarged scale a sectional view along line of section III—III drawn in FIG. 2.
Figure 4:
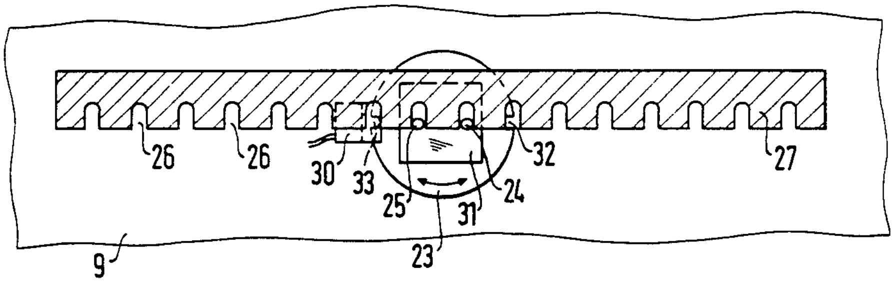
FIG. 4 shows a sectional view along the line of section IV—IV drawn in FIG. 3.
Figure 5:
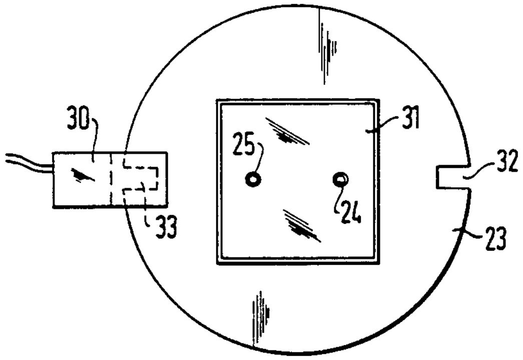
FIG. 5 shows, on an enlarged scale, disc having an eccentric shown in FIG. 4.

A conveyor device 5, which is illustrated in greater detail in FIGS. 3 to 5, serves to displace input magazine 2 in the longitudinal direction of support bar 13. The said conveyor device 5 is fitted to baseplate 9, as shown in FIG. 1.

A sorting device 6 is shown in FIG. 1 in the inlet area of testing device 4. This sorting device is used to convey components supplied to it from input magazine 2, individually and consecutively, into a testing and measuring area of testing device 4. In the area of input magazine 2 devices may suitably be provided which bring the said area and hence the components in it to a desired temperature. Such devices will normally be heating devices.

As shown in FIG. 1, a further conveyor device 7 is provided between testing device 4 and output magazine 3. The purpose of this conveyor device 7 is to convey components supplied to it from testing device 4 to output magazine 3.

In addition to the previously considered elements, the machine shown diagrammatically in FIG. 1 also exhibits a fixed photoelectric gating device, generally denoted by 11, at the bottom of input magazine 2, and indicating devices 17, also fixed, above the said input magazine 2.

As shown in FIG. 2, fixed photoelectric device 11 incorporates a large number of light gates 16, which are arranged horizontally in a row, and separated by a mutual distance which is equal to the mutual distance between two adjacent component receiving portions 18 of input magazine 2. Component receiving portions 18 are formed by projections from a support plate, between which grooves 19 are formed. This arrangement of component receiving portions 18 is ideally suited for receiving integrated chips which have connections which lie in two parallel rows.

Indicating devices 17, which may be formed by light emitting diodes, are provided so that they are the same distance apart as light gates 16. Thus one light gate 16 at the bottom, and one indicating device 17 at the top, are assigned to each component receiving portion 18 in every adjustable position of input magazine 2.

Photoelectric gating device 11 is arranged, relative to the input magazine, so that, as shown in FIG. 1, it can be determined at all times whether a component 8 is contained in the said component receiving portion 18. In every adjustable position of input magazine 2, this arrangement enables the state of occupation of the individual component receiving portion 18 to be determined by means of light gates 16, so that this information can be supplied to a central processing device which will be described with reference to FIG. 10.

In connection with the processing device just mentioned it should also be pointed out that it interacts with indicating devices 17 in such a manner that, regardless of the present adjusted position of input magazine 2, those component receiving portions 18 which can be refilled are marked by a suitable indication.

The lower half of FIG. 2 shows sorting device 6, which can be driven by an electric motor 21, which device exhibits two conveyor belts which are provided opposite an opening in a contact plate located underneath photoelectric device 11. A stop element 20 is provided between the said opening, whose size is such that only components from one component receiving portion 18 can pass through at a time, and sorting device 6. This stop element 20, which should preferably be actuated by an electromagnet, is used for supplying components from input magazine 2 to a suitable point of contact on sorting device 6, and to move input magazine 2 relative to sorting device 6, which has a fixed arrangement. This function could also be performed in principle without separating stop device 20, if sorting device 6, or the device supporting it, were to be swivelled at right angles to the drawing plane.

FIG. 3 illustrates in greater detail, in an enlarged side view, conveyor device 5, shown diagrammatically in FIG. 1, which device is used as the first conveyor device for moving input magazine 2 in the direction of the arrow drawn in FIG. 2. The said conveyor device 5 incorporates a normal electric motor 22, which is fitted to baseplate 9 and which, on its drive shaft, not shown in greater detail, supports disc 23 having an eccentric, on the top of which is fitted a square section 31, from which eccentric pins 24, 25 project. The arrangement of eccentric pins 24, 25 is chosen so that they lie on a line which runs through the centre of the disc 23, as shown in FIGS. 4 and 5.

Eccentric pins 24, 25, which in practice project from the disc 23, engage openings 26 of a rack-type rail element 27, which is connected to input magazine 2, or forms part of this magazine. Openings 26 are of such a shape and depth that eccentric pins 24, 25 are able to move in the said openings 26, in the course of rotation of the disc 23, thus enabling input magazine 2 to travel a defined distance. This distance is equal to the distance between the two eccentric pins 24 and 25.

As shown in FIG. 4, the disc 23 is always stopped in a position in which the line of connection between the center of the disc 23 and eccentric elements or eccentric pins 24, 25 runs in the direction of displacement of input magazine 2. This ensures that in practice the input magazine stops automatically so that it cannot be displaced accidentally.

In order to guarantee the above-mentioned adjustment of the disc 23 in the stopping position, a position fixing device is provided in the form of a single photodetector barrier 30, which has a light transmitter and a light receiver, and which enables the appearance of one recess out of two diametrically opposite recesses 32,33 round the periphery of the disc 23 to be detected. The said photodetector barrier is connected to the control device already mentioned.

FIG. 3 also shows that a support plate 28, belonging to input magazine 2, is provided with component receiving portions 18, which are capable of receiving components, which may in this case be integrated chips 8. The connections of the said integrated chips 8 are in this case received by grooves 19 which are provided on both sides of the said component receiving portions 18. In order to prevent the components or integrated chips 8 from falling from their component receiving portions 18, the said components or integrated chips 8 are covered on top with a cover rail, as indicated in FIG. 3.

With regard to the configuration of component receiving portion 18 and grooves 19, shown specially in FIG. 3, it should also be noted that the support plate struts provided between two adjacent grooves are not drawn separately in FIG. 2; moreover, the object may in principle also be achieved without such struts.

Figure 6:
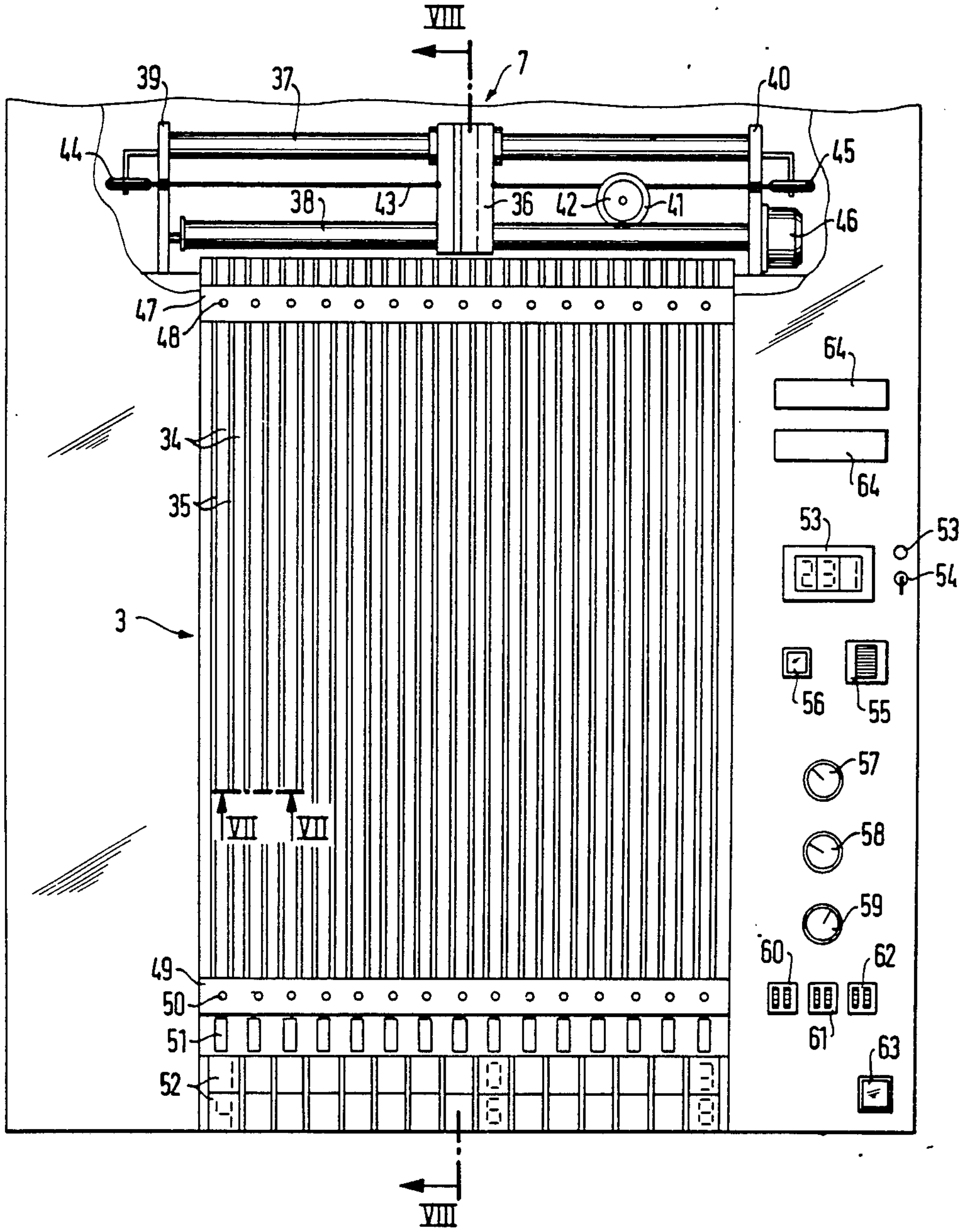
FIG. 6 shows in an elevation, along arrow VI drawn in FIG. 1, an output magazine for components.

FIG. 6 illustrates in greater detail, in an elevation, output magazine 3 used in the machine shown in FIG. 1, together with the associated second conveyor device 7. However, output magazine 3 is in this case illustrated without the use of cover rails, which ensure that components supplied to output magazine 3 cannot jump out of it.

Figure 7:
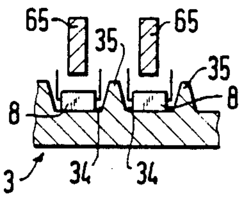
FIG. 7 shows an enlarged sectional view along the line of section VII—VII drawn in FIG. 6.

Output magazine 3 shown in FIG. 6 exhibits a series of parallel ducts (or channels) 34, which are separated by projections or struts 35, as shown in the enlarged partial sectional view in FIG. 7. Ducts 34 are designed so that they are capable of receiving components or integrated chips 8, which are now, of course, located to the rear to a certain degree. In this connection, FIG. 7 illustrates the use of cover rails 65, which ensure that components 8 cannot escape from ducts 34.

As shown in FIG. 6, output magazine 3 exhibits, on its upper side representing the inlet side, a photoelectric gating device 47, with a row of light gates 48, and in its lower area, serving as the outlet area, a light gate arrangement 49, with a series of light gates 50. The said light gates each comprise a light transmitter and a light receiver. Their arrangement is such that one light gate per duct or component recess 34 is provided in each photoelectric gating device. This enables the said light gates to detect the entry of components or integrated chips located within their range.

Figure 8:
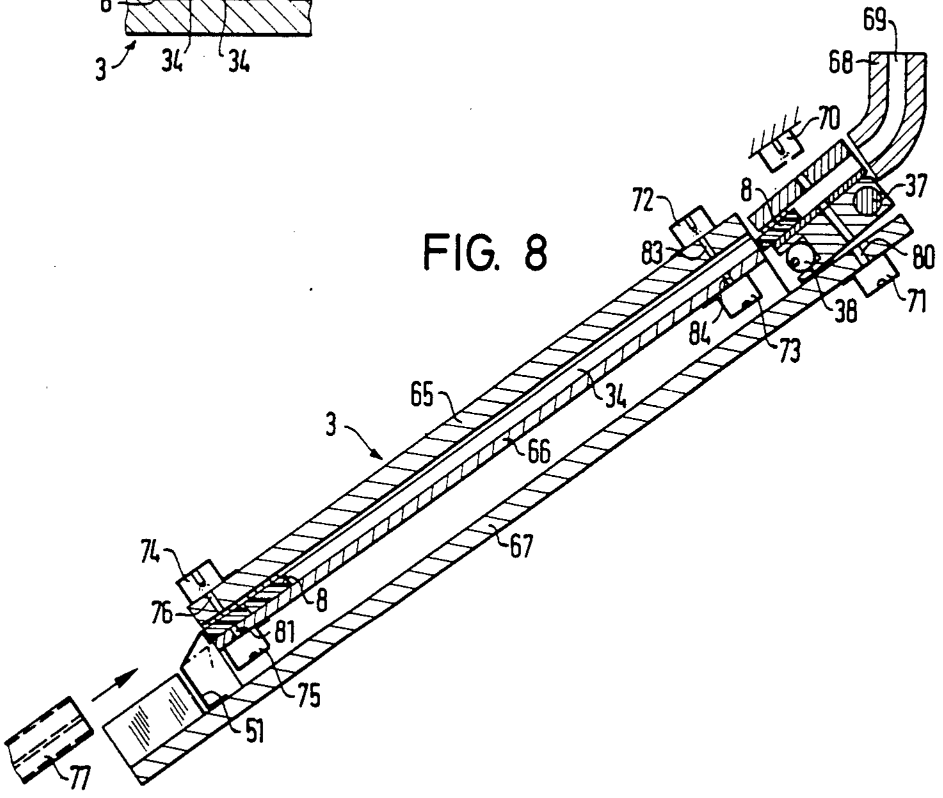
FIG. 8 shows a sectional view along the line of section VIII—VIII drawn in FIG. 6.

The individual component receiving portions or ducts 34 are sealed underneath photoelectric device 49 by springs 51, which have the shape shown in FIG. 8.

According to FIG. 6, the individual component receiving portions or ducts 34 of output magazine 3 are provided with indicating devices 52, which are storage and indicating devices whose indicating section is in this case a digital indicating section comprising two indicating elements. These indicating elements may, for example, be formed by two seven-segment indicating elements. Indicated values which relate to the measuring and test classes into which the components discharged from testing device 4 to output magazine 3 are to be sorted, can be stored and indicated (displayed) by means of these storage and indicating devices 52. More details are given of the processes relating to this with reference to FIG. 10.

FIG. 6 illustrates in greater detail, above output magazine 3, the second conveyor device 7, already mentioned in connection with FIG. 1. This conveyor device 7 comprises a carriage 36, which can be moved along a guide rod 37 and along an eccentric rod 38, by means of a drive motor 41, which is a normal step motor. The said motor 41 supports a rope pulley 42 round which is wound a rope 43, attached to carriage 36, which rope is also wound round two rope pulleys 44, 45 fitted to support plates 39 and 40 respectively.

The aforementioned eccentric rod 38, in whose longitudinal direction carriage 36 may be moved, may be rotated by means of an electric motor 46 fitted to support plate 40.

In addition to the previously considered elements, FIG. 6 shows further adjusting and indicating elements. These indicating elements include, among other things, a temperature or heat indicating device 53, which provides a heating temperature indication and a heat control. Also provided is a switch 54, with which the heating can be switched on separately, the heating system being located in the area in front of sorting device 6 shown in FIG. 1. Also provided, according to FIG. 6, are a further heating adjustment device 55, and a heat control indicating device 56. The mode of operation of output magazine 3 can be set by means of a setter (adjuster) 57, and the mode of operation of the entire machine can be set by means of a setter (adjuster) 58. A heating temperature may be set by means of a setter (adjuster) 59, and the capacity per component duct 34 of output magazine 3 may be preselected by means of a setting device 60. The holding time in the above-mentioned heating area, in front of sorting device 6 shown in FIG. 1, may be selected by means of a setter 61. The repetition of test processes in testing device 4 may be set by means of a switch 62. An on/off indicating device 63 indicates whether the entire system is in the on or off condition.

In addition to the above-mentioned indicating and adjusting elements, FIG. 6 shows further indicating and adjusting elements 64, which may be provided for various purposes, for example for indicating the times determining the execution of test processes in the system concerned.

FIG. 8 illustrates in greater detail output magazine 3 shown in FIG. 6, together with conveyor device 7, and a section of the testing device, in a sectional view. According to FIG. 8, a baseplate 67, to which is fitted output magazine 3, by means of fastening plates not shown in greater detail, is located underneath support device 3 and underneath conveyor device 7. FIG. 8 shows a support plate 66, of output magazine 3, which plate has two components 8 received in a duct 34. In FIG. 8, one of cover rails 65 already mentioned in connection with FIG. 7, is provided above the said components.

A light transmitter 72, and a light receiver 73, are provided at the upper inlet end of output magazine 3, as shown in FIG. 8. Light transmitter 72, together with light receiver 73, form one of light gates 48 illustrated in FIG. 6. The light emitted from light transmitter 72 passes through openings 83, 84 located in cover rail 65 and support plate 66 respectively.

A light transmitter 74 and a light receiver 75 are arranged at the lower outlet end of output magazine 3, as shown in FIG. 8. Light transmitter 74 and light receiver 75 each form one of light gates 50 shown in FIG. 6. The light emitted from light transmitter 74 is able to pass through openings 76, 81 located in cover rail 65 and support plate 66 respectively. However, the light emitted from light transmitter 74 is only able to reach associated light receiver 75 when there is no component 8 in the relevant light path in the area of duct 34 serving as the component duct.

A stirrup type spring 51 closes against the outlet area of duct 34 of output magazine 3. This spring 51 may be forced down by presenting a bar magazine 77 to the relevant outlet end of output magazine 3, so that components 8 contained in the associated duct 34 of output magazine 3 can slide out and be collected (received) by bar magazine 77. Once the emptying process is completed, spring 51 again seals the associated duct 34.

According to FIG. 8, conveyor device 7, in its component receiving position, is located at the inlet end of output magazine 3. In this position eccentric rod 38 is adjusted so that a component 8 contained in the said conveyor device 7 is able to strike against the front of support plate 66 of output magazine 3, but cannot enter duct 34, which lies exactly opposite conveyor device 7 and hence the said component 8.

On the component inlet side of conveyor device 7 is shown a photoelectric gating device consisting of a fixed light transmitter 70, and a light receiver 71, also in a fixed arrangement. The light emitted from light transmitter 70 is able to reach the associated light receiver 71 through an opening 80 made in baseplate 67. The light path in question is permeable in the area in which conveyor device 7 is located. The signals thus obtained from the aforementioned light barrier device can be used, and are used for suitable adjustment of conveyor device 7 relative to testing device 4. Conveyor device 7 can therefore be moved along guide rod 37 and eccentric rod 38 into any desired adjusting position.

FIG. 8 illustrates diagrammatically a component discharge section of the testing device on the component inlet side of conveyor device 7. The testing device discharges tested components to conveyor device 7 through a component duct 69 of this component discharge section 68.

Figure 9:
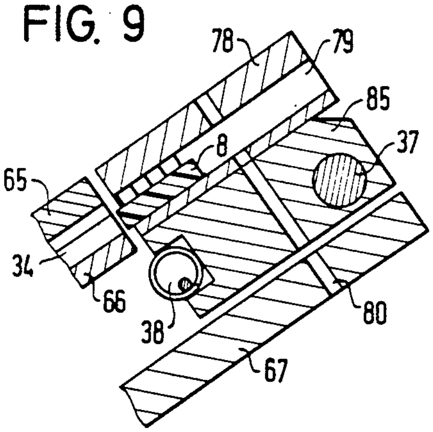
FIG. 9 shows, on an enlarged scale, a sectional view of a conveyor device already shown in FIG. 8.

FIG. 9 illustrates in greater detail conveyor device 7 shown in FIG. 8, in an enlarged sectional view. According to FIG. 9, conveyor device 7 is shown in its component discharge position. In this position eccentric rod 38 is rotated as shown in FIG. 8 relative to the adjusting position. In the position shown in FIG. 9, a component 8, contained in a component duct 79 of a component receiving section 78 of conveyor device 7, is able to slide out and into duct 34, forming a component duct, which duct is located in output magazine 3, of which only the associated support plate 66 and a cover rail 65 is illustrated in FIG. 9.

Below component receiving section 78 is located a support section 85, which can be moved along support rod 37, and also along eccentric rod 38, and which can be swivelled by the rotation of eccentric rod 38 about support rod 37. In the course of such swivelling the component receiving section 78 is also swivelled correspondingly.

FIG. 9 illustrates baseplate 67, below support section 85, with one of its openings 80.

Figure 10:
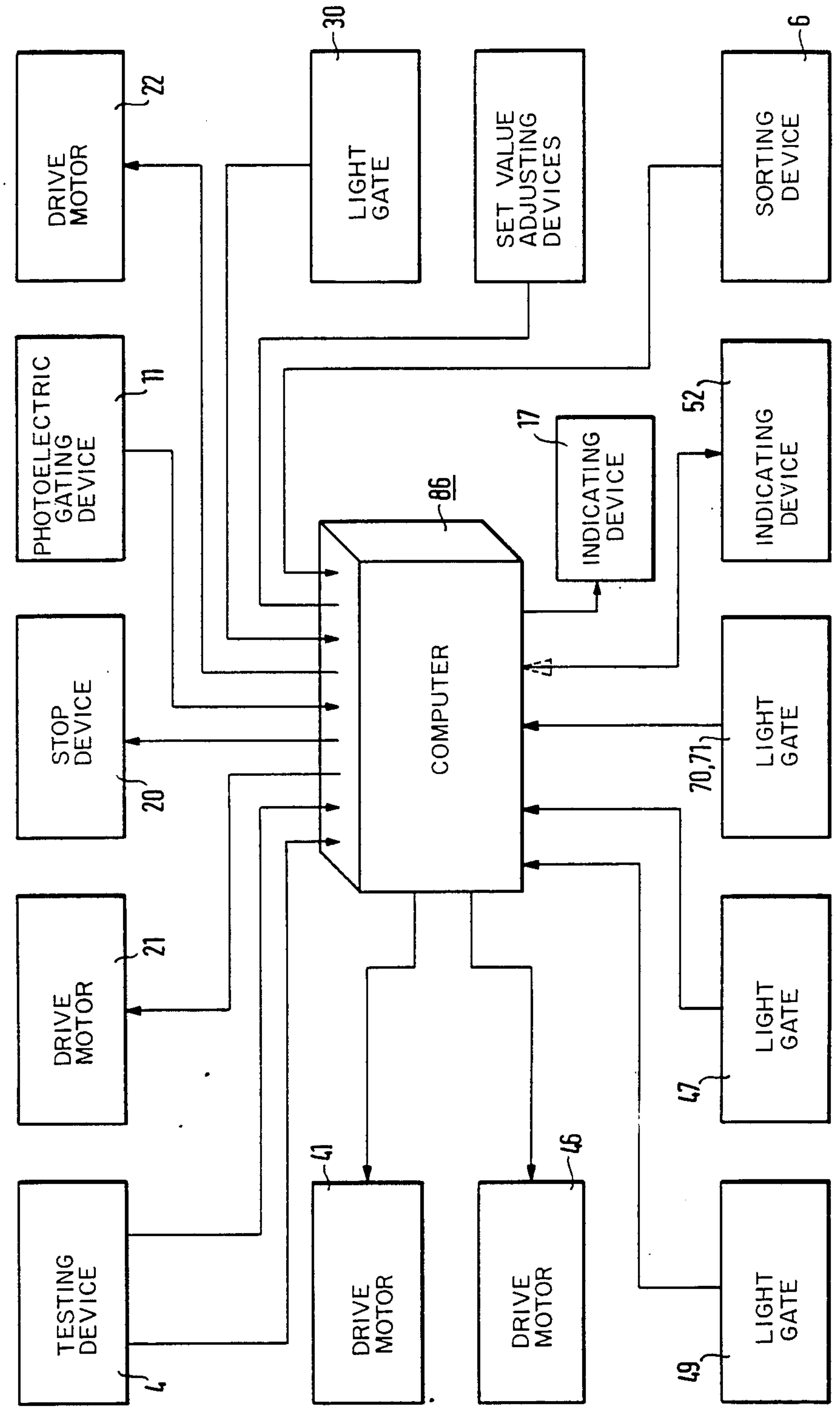
FIG. 10 shows, in a block diagram, one possible construction of a control device which controls the operation of the machine shown in FIG. 1.

In the block diagram of FIG. 10 there is illustrated the control device already mentioned in the course of the above description. This control device comprises, among other things, a computer 86, which may take the form of a microcomputer, with at least one microprocessor, a program memory and a working memory. This computer 86 is supplied with a series of information signals which it requires for determining (detecting) control signals. The control signals are transmitted to a number of devices.

Information signals are transmitted to computer 86 from photoelectric gating device 11, from light gate 30, from a light gate provided behind sorting device 6, from light gate device 70, 71, from light gate device 47, from light gate device 49, from testing device 4 and from the set value adjusting devices which enable the temperature and holding time of components to be tested to be adjusted in the testing device, for example.

The control signals generated by computer 86 are transmitted essentially to indicating device 17, indicating device 52, as well as to drive motors 21, 22, 41, 46, and to stop device 20. Indicating device 52 may, in contrast to the conditions shown in FIG. 10, also be connected to computer 86 for transmitting information signals, where this device 52 is a storage and indicating device which enables information values associated with individual component test and measuring classes to be stored and indicated.

The control system for conveying individual components 8 to be tested from input magazine 2 to testing device 4, and the control system for the discharge of such tested components from testing device 4, need not be explained further here.

The processes relating to this control system should be considered as normal control processes. Because of their particular significance, however, the processes which take place for the conveying and distribution of components 8 discharged from testing device 4 are considered in the following. These processes are illustrated in greater detail below with reference to FIG. 6.

When conveyor device 7 has received a component 8 from testing device 4, testing device 4 has supplied computer 86 with information on the test and measuring class into which the component in question falls. Computer 86 then determines whether a component receiving portion associated with such a test and measuring class already exists in output magazine 3. If the individual component receiving ducts of output magazine 3 are permanently allocated to different test or measuring classes, computer 86 can quickly establish the appropriate component receiving portion of output magazine 3. Conveyor device 7 is then moved to the appropriate component receiving portion, for which purpose a suitable control signal is transmitted to drive motor 41. When the desired setting position is reached, as a result of the response by computer 86, computer 86 transmits a control signal to drive motor 46, which then swivels conveyor device 7 so that the component is discharged into the appropriate component receiving portion of output magazine 3. Computer 86 then transmits further control signals to drive motors 41 and 46 for returning conveyor device 7 to the position in which they are able to receive a further component from testing device 4.

The device according to the invention can also be operated by a method other than that just considered. The individual component recesses of output magazine 3 need not initially be allocated to any particular testing or measuring classes, but can be allocated in the course of conveyance of components to output magazine 3. This takes place as follows.

When an information signal indicating the presence of a component to be conveyed to output magazine 3 is again transmitted to computer 86, according to FIG. 10, from light gate device 70, 71, and when computer 86 at the same time receives corresponding information signals on the appropriate testing and measuring class into which the component in question falls, from testing device 4, computer 86 may, in the event that no component receiving portion associated with this testing and measuring class is yet available, establish such a component receiving portion in output magazine 3. For this purpose computer 86 may store a suitable signal in an internal storage device, or in a storage device associated with indicating device 52, and may permit a suitable indication to be given by indicating device 52 associated with the said selected component recess. Drive motors 41, 46 are then actuated (started) by suitable means, as already explained.

When a further component is to be supplied to output magazine 3 after the process just considered, which component falls into a test or measuring class for which a component receiving portion is already reserved in output magazine 3, the component in question is then conveyed by means of conveyor device to the appropriate component receiving portion. This takes place with drive motors 41, 46 under the control of computer 86, which generates appropriate adjusting information from the information signals which it receives from light gate device 70, 71, from testing device 4, and from the storage device in which the allocation of the individual component receiving portions to test and measuring classes is stored.

In order to ensure that components are also conveyed correctly to appropriate component receiving portions of output magazine 3 in cases where a component receiving portion is already filled with components, the latter condition is reported separately to computer 86. The information signals which can be transmitted to computer 86, from light gate device 47, together with adjusting signals which are transmitted to computer 86, for example, from adjusting device 60 already mentioned in connection with FIG. 6, are used for this purpose. When the pre-established number of components has been determined (detected) by means of a light gate of light gate device 47, and computer 86 has recognised this, it may deduce from this that the relevant component receiving portion is full. The signals contained in the aforementioned storage device of computer 86, or in the storage device of indicating device 52 associated with the appropriate component receiving portion, can then be modified or processed in such a manner that they mark or indicate the fact that their associated component receiving portion is no longer able to receive components. When output magazine 3 is then to be supplied with a component which would have to be conveyed to a component receiving portion which is marked as incapable of receiving the component, as already described, computer 86 establishes a further component receiving portion not yet occupied, for which the appropriate test and measuring class is then established and indicated.

By the method previously described, different test and measuring classes can be flexibly determined and established in output magazine 3. It is therefore possible, without much difficulty, to receive in the individual component receiving portions of output magazine 3 components which are assigned to test and measuring classes over a very wide range, about the number of which no experience or information has yet been put forward.

When a component receiving portion of an output magazine 3, which is marked as no longer able to receive components because it is already filled with components, is emptied by means of a bar magazine 77, as has been explained in connection with FIG. 8, indicating devices 52 associated with the appropriate component receiving portion, and the storage device in which the allocation between the measuring and testing class and the appropriate component receiving portion is stored, are returned to their initial conditions. The said component receiving portion is therefore again available for renewed use for receiving components.

Finally it should also be pointed out that, in contrast to the conditions described in connection with FIGS. 1 to 9, the components could be received by the same method both in the input magazine and in the output magazine, for example as illustrated above with regard to the input magazine. In this case a component turning device could be suitably provided in the area of the measuring device.

What is claimed is:

1. In a device for conveying components received in individual, separate receiving portions of an input magazine, to individual, separate receiving portions of an output magazine, with a testing device arranged between the input magazine and the output magazine, to which are supplied, one after the other, by means of a first conveyor device, the individual components, from the receiving portions of the input magazine, for testing, and which discharges the tested components to a second conveyor device, which enables the components to be discharged to a receiving portion of the output magazine established by the testing device, the combination of storage and indicating devices associated with each receiving portion of the output magazine, which devices are each capable of storing and indicating information corresponding to a component testing or measuring class, and means for moving the second conveyor device in such a manner, relative to the receiving portions of the output magazine on the basis of comparison of data from said testing device and preassigned data stored in the individual storage and indicating devices, that a component, established by the testing device as belonging to a certain component testing or measuring class, can be discharged into the receiving portions associated with this testing or measuring class, said means for moving the second conveyor device also being operative to assign to the storage and indicating device of an available receiving portion a testing or measuring class corresponding to data received from said testing device which does not correspond to preassigned data and to discharge components of such testing or measuring class into said receiving portion.

2. A device according to claim 1, wherein each individual storage and indicating device comprises a storage portion and a multi-segment indicating portion.

3. A device according to claim 2, wherein each storage and indicating device is resettable to an initial condition after its associated receiving portion has been emptied of components.

4. A device according to claim 3, wherein the second conveyor device is constructed to receive only one component at a time.

5. A device according to claim 2, wherein the second conveyor device is constructed to receive only one component at a time.

6. A device according to claim 1, wherein each receiving portion is provided with an alarm device which, when the said receiving portion has been completely filled with components, marks this receiving portion as no longer capable of receiving components.

7. A device according to claim 6, wherein the second conveyor device is constructed to receive only one component at a time.

8. A device according to claim 1, wherein the second conveyor device is constructed to receive only one component at a time.

9. A device according to claim 1, wherein the second conveyor device is arranged to be moved, by means of a cable pull device relative to the receiving portions of the output magazine, and is adjustable by means of a swivel device to a position between a component discharge position and a component locking position.

10. A device according to claim 1, wherein the receiving portions of the output magazine are each sealed by a spring element, on their component discharge side, which element is arranged to be brought out of its locking position into a release position by means of an emptying device.

* * * * *